(12) United States Patent
Johansson (10) Patent No.: US 6,967,430 B2
(45) Date of Patent: Nov. 22, 2005

(54) FLAT RESONATING ELECTROMECHANICAL DRIVE UNIT

(75) Inventor: Stefan Johansson, Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 210 days.

(21) Appl. No.: 10/674,339

(22) Filed: Oct. 1, 2003

(65) Prior Publication Data

US 2005/0073219 A1   Apr. 7, 2005

(51) Int. Cl.[7] .............................. H01L 41/08; H02N 2/00
(52) U.S. Cl. ...................... 310/328; 310/330; 310/331; 310/332
(58) Field of Search .......................... 310/328, 330–332

(56) References Cited

U.S. PATENT DOCUMENTS

| | | | | |
|---|---|---|---|---|
| 4,613,782 A | * | 9/1986 | Mori et al. ............ | 310/323.16 |
| 5,049,775 A | * | 9/1991 | Smits ........................ | 310/328 |
| 5,089,740 A | | 2/1992 | Ono | |
| 5,132,582 A | * | 7/1992 | Hayashi et al. ........ | 310/323.16 |
| 5,233,258 A | | 8/1993 | Myoga et al. | |
| 5,453,653 A | | 9/1995 | Zumeris | |
| 5,640,063 A | | 6/1997 | Zumeris et al. | |
| 5,709,802 A | * | 1/1998 | Furuhata et al. ............... | 216/2 |
| 5,900,691 A | * | 5/1999 | Reuter et al. ............... | 310/348 |
| 6,157,115 A | * | 12/2000 | Hassler, Jr. .................. | 310/328 |
| 6,373,170 B1 | | 4/2002 | Hills | |
| 6,392,328 B1 | | 5/2002 | Ashizawa | |
| 6,437,485 B1 | * | 8/2002 | Johansson .................... | 310/332 |
| 6,448,694 B2 | * | 9/2002 | Matsuo et al. ............... | 310/328 |
| 6,545,384 B1 | * | 4/2003 | Pelrine et al. ............... | 310/309 |

FOREIGN PATENT DOCUMENTS

| | | | |
|---|---|---|---|
| DE | DD 143 682 | 9/1980 | |
| GB | 2 381 376 | 4/2003 | |
| JP | 5121790 | * 5/1993 | ............ B12B 5/00 |
| SE | 9300305-1 | 4/1999 | |

* cited by examiner

Primary Examiner—Thomas M. Dougherty
(74) Attorney, Agent, or Firm—Young & Thompson (57) ABSTRACT

An electromechanical motor (1) has a driving element (30) comprising two electromechanical sections (32, 34) extended substantially parallel to a driving surface (14) of a body (10) to be moved. The electromechanical sections (32, 34) are rigidly supported by a backbone portion (22) of a stator (20) at a first end (38). An link member (40) having a single actuating portion (42), which by its interaction with the driving surface (14) of the body (10) moves the body (10), is attached between respective second ends (36) of the electromechanical sections (32, 34). The electromechanical sections (32, 34) are excitable in a vibration mode having strokes substantially perpendicular to the direction of motion (12). A portion of the link (40) or the joints (46, 54) between the link member (40) and the electromechanical sections (32, 34) have a bending stiffness in the direction of the strokes that is significantly lower than the bending stiffness of the electromechanical sections (32, 34) themselves.

15 Claims, 7 Drawing Sheets

FLAT RESONATING ELECTROMECHANICAL DRIVE UNIT

TECHNICAL FIELD

The present invention relates in general to electromechanical actuators and in particular to small electromechanical actuators operating at or close to a resonance frequency.

BACKGROUND

There are numerous general technical applications with the need for extremely miniaturised motors that are able to make controlled fine-positioning. Among these, portable consumer devices, such as e.g. cameras, have additional demands for low power consumption, low weight and price. The required motion is typically linear but often a rotating motor combined with a motion-converting mechanism such as a lead-screw is used. The motion range is often in the order of millimeters. The demands described above are difficult to satisfy simultaneously by one and the same motor design.

Generally, the use of a solid actuator material and some type of magnification mechanism appear to be the best solution for the desired miniature motors. A solid actuator such as a PZT element has a very high energy density and the size of a motor could therefore be made very small. Typically, existing actuator materials with high energy density are not able to change its shape more than a tenth of a percent, which makes it difficult to make an optimised construction with small external dimensions. Many different solutions have been proposed in prior art. A few typical examples are discussed below.

In U.S. Pat. No. 6,373,170, two separate actuator blocks inclined with a given angle relative to each other uses an interlinking drive pad to drive a rail. The actuators are operating with a so-called 33-actuation. The overall V-shaped unit extends perpendicular to the moving rail. The two actuators are driven in a longitudinal mechanical resonance with a phase shift between the two actuators giving an elliptical trajectory of the drive pad. When making the components small, in the order of a few millimeters, longitudinal resonance frequencies will occur in the vicinity of the MHz range. In many applications, such frequencies will give rise to electromagnetic interference and will not be accepted. It is also practically difficult to operate devices at such frequencies. Also, the geometrical design, using a non-negligible angle between the actuator block and the rail makes the assembly unsuitable for miniaturised motors.

In U.S. Pat. No. 5,453,653, one actuator plate with several electrodes operates with 31-actuation with two different resonance modes at the same time. This creates an elliptical trajectory if there is a phase shift between the applied voltage signals. Since one longitudinal resonance mode is used also here, similar objections as in the previous disclosure exist also here. In this case they become even more severe, since the geometry is further restricted by the demand that a bending mode resonance should occur at approximately the same frequency. Furthermore, the perpendicular geometry in relation to the body to be moved is unsuitable for small-size applications.

One component that has been used in numerous applications is a piezoelectric bimorph element since a high internal motion magnification can be achieved in a bending mode. A motor intended for applications, which demand extremely small sizes, was constructed and presented in the Swedish patent SE9300305-1. Rotation or linear translation is performed by stepwise motion with bimorph elements in direct contact with the object to be moved. In this invention, the bimorph elements are driven in such a way that the contact point of the bimorph element moves in two dimensions, i.e. the bimorph is used both in the bending and the longitudinal direction.

In the German patent DD 143 682, a piezoelectric stick-slip motor is disclosed. Two bimorphs consisting of a steel/piezoelectric element sandwich are connected by an intermediate passive steel part. A lever connected to the passive part act on a wheel to be driven, The in-phase bending of the bimorphs is used for driving the wheel while the out-of-phase bending of the bimorphs rotates the passive part and varies the contact pressure on the wheel. The construction is however, unsuitable for applications where the space around the body to be moved is limited.

In the U.S. Pat. No. 5,089,740 a driving mechanism based on bimorphs is disclosed. A complex gate-shaped arrangement of bimorphs with coupled motion patterns is presented, which has a relatively high rigidity. However, the entire arrangement is space consuming, and using parts of the arrangement will remove the advantages of the coupled motions.

U.S. Pat. No. 6,392,328 discloses an arrangement with one actuator beam with several electrodes. The beam operates with an 31-actuation at two different resonant modes that create elliptical trajectories of two drive pads in contact with a rail oriented parallel to the beam. The beam is attached to a support in the central part of the beam. Also here a longitudinal resonance is used, which gives the disadvantages mentioned above. Furthermore, the use of more than one drive pad restricts the maximum step length in relation to the length of the actuator arrangement.

In U.S. Pat. No. 6,437,485, an actuator arrangement suitable for limited lateral space around a body to be driven is disclosed. One actuator beam, comprising several electrodes and arranged substantially parallel to the body, operates with 31-actuation close to a fundamental resonance frequency. The beam is supported against a base substantially at the ends, and a single drive pad is arranged in the centre of the beam. An asymmetric supply of voltages to the two sides of the beam and a frequency slightly off-resonance are used to achieve a two-dimensional trajectory of the drive pad. The advantages with this arrangement are many. It requires very small lateral space in the vicinity of the body, the use of a single drive pad enables long strokes and the near-resonance operation reduces electronics requirements. However, it is relatively difficult to achieve a sufficient efficiency.

SUMMARY

It is an object of the present invention to provide electromechanical actuator systems suitable for miniaturizing, and in particular having a small lateral extension. A further object of the present invention is to provide electromechanical actuator systems possible to operate without causing electromagnetic radiation interference. Another object of the present invention is to provide electromechanical actuator systems having improved efficiency and stroke.

The above objects are achieved by actuator systems according to the enclosed patent claims. In general, an actuator system has a driving element comprising two electromechanical sections extended substantially parallel to a driving surface of a body to be moved. The electromechanical sections are rigidly supported by a backbone portion of a stator at one end. A link member having a single actuating section, which by its interaction with the driving surface of the body moves the body, is attached between respective second ends of the electromechanical sections. The electromechanical sections are excitable in a vibration mode having strokes substantially perpendicular to the direction of motion of the body. A portion of the link or the joints between the link and the electromechanical sections have a bending stiffness in the direction of the strokes of the electromechanical sections that is significantly lower than the bending stiffness of the electromechanical sections themselves. Such arrangement provides for an isolation of the vibrations of each of the electromechanical sections. The electromechanical sections are preferably monomorphs, bimorphs or multimorphs of electromechanical material volumes. The link member preferably comprises a number of rigid sections interconnected by bendable sections.

There are several advantages with the present invention. The geometrical design is very suitable for small size actuator systems, since the lateral extension perpendicular to the motion direction can be made extremely small. Furthermore, the use of bending mode vibrations makes it possible to operate also very small actuator systems at frequencies well below the MHz region. The rigid support of the electromechanical bendable sections as well as the low bending stiffness of the link and/or link joints also opens up for independent resonant operation of the two sections, which allows power-efficient operation.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
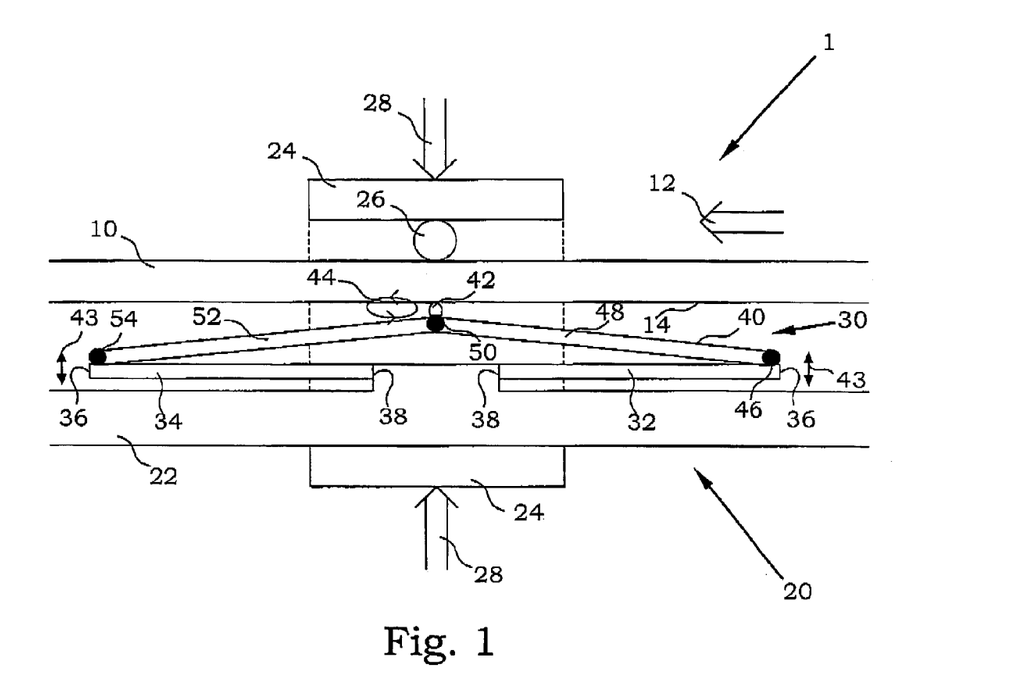
FIG. 1 is a schematic drawing of an embodiment of an electromechanical motor according to the present invention.

In FIG. 1, an embodiment of an electromechanical motor 1 according to the present invention is illustrated. The electromechanical motor 1 comprises a stator 20 and a body 10 to be moved. An arrow 12 indicates a displacement direction of the body 10 relative to the stator 20. The stator 20 comprises a backbone portion 22 and a driving element 30. The driving element 30 comprises two electromechanical sections 32, 34 and a link member 40. The electromechanical sections 32, 34 are elongated and extend substantially parallel to the displacement direction 12. The electromechanical sections 32, 34 are at a respective first end 38 rigidly supported by the backbone portion 22. The link member 40 interconnects a respective opposite second end 36 of the electromechanical sections 32, 34.

The driving element 30 is pressed against the body 10 with a normal force 28 by resilient means 24 via the backbone portion 22 and a linear bearing means 26.

The link member 40 comprises in the present embodiment two rigid members 48, 52, attached to a respective electromechanical section 32, 34 with joints consisting of a respective bendable section 46, 54. The rigid members 48 are interconnected by another bendable section 50. The link member 40 comprises a single actuating portion 42, which is intended to be, at least occasionally, in contact with an interaction surface 14 of the body 10. By this contact, the actuating portion 42 interacts with the interaction surface 14, causing the body 10 to move in the displacement direction 12. The actuating portion 42 is in the present embodiment constituted by a drive pad.

The electromechanical sections 32, 34 comprise electromechanical active material, preferably piezoelectric ceramics, which are provided with electrodes in order to allow for application of voltages over the electromechanical volumes. Such a voltage application will result in a shape alteration of the electromechanical volume. Depending on the actual design of the electromechanical sections 32, 24, different types of motions can be created. The details of preferred embodiments of electromechanical sections 32, 34 are discussed further below. However, here we just notice that the electromechanical sections 32, 34 are arranged in such a way that a bending vibration can be excited in the electromechanical sections 32, 34. This bending vibration has a stroke substantially directed perpendicular to the displacement direction 12 and the interaction surface 14.

Since the electromechanical sections 32, 34 are rigidly supported by the backbone portion 22 at their first ends 38, such a bending vibration will cause the second ends 36 of the electromechanical sections 32, 34 to move essentially up and down, as indicated by arrows 43. Such a motion will also cause the link member 40 to move. However, due to a reduced bending stiffness of the bendable sections 46, 54, the actual vibration will not be transferred over to the other electromechanical section 32, 34. In other words, the position of the link end will indeed be determined by the position of the tip of the electromechanical section 32, 34, but the vibration as such will not further influence the motion of the link 40. This enables the different electromechanical sections 32, 34 to have independent vibrational behaviors. If the bending vibration of one of the electromechanical sections 32, 34 has a different phase than the other one, the link member 40 will cause the actuating portion 42 to move in an elliptical path, as indicated by a closed arrow 44.

FIGS. 2a–2d will illustrate such a motion more in detail. In these figures, the vertical stroke of the electromechanical sections 32, 34 are strongly exaggerated in order to vise the operation. In reality, the strokes are only fractions of the thickness of the electromechanical sections 32, 34.

Figure 2A:
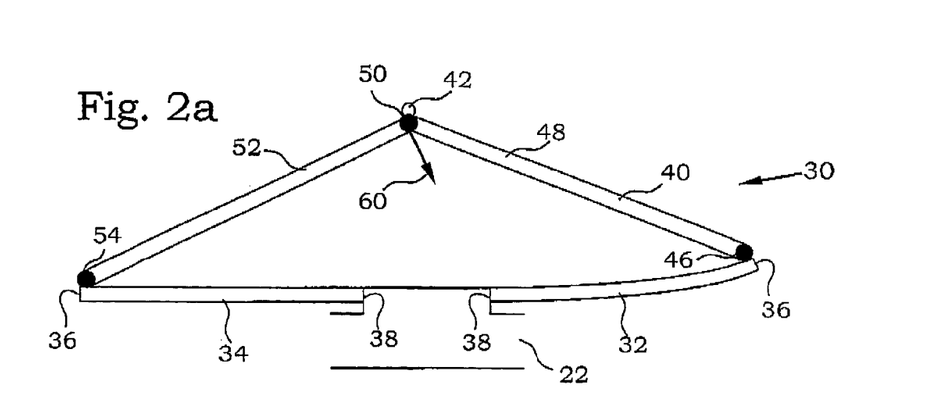
FIG. 2a–2d are schematic drawings illustrating different situations in an operating sequence of a motor according to FIG. 1.

In FIG. 2a, the left electromechanical section 34 is excited in such a way that the electromechanical section 34 is straight. However, the right electromechanical section 32 is instead excited in such a way that it bends it second end slightly upwards in the figure. These shapes of the electromechanical sections 32, 34 result in that the actuating portion 42 is positioned somewhat to the left of the symmetry axis and slightly elevated in relation to the actuating portion 42 position with both electromechanical sections 32, 34 being straight. From this situation, both electromechanical sections 32, 34 are caused to bend downwards, which gives the actuating portion 42 a motion directed in a direction indicated by an arrow 60.

Figure 2B:
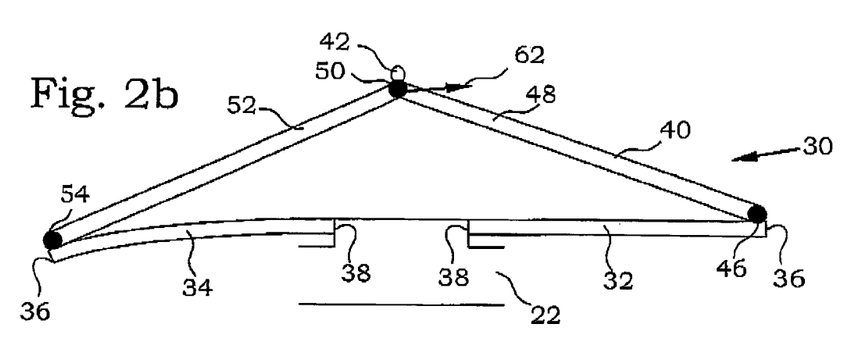

In FIG. 2b, the left electromechanical section 34 is bent down, and the right electromechanical section 32 has regained its straight shape. This results in a position of the actuating portion still to the left of the symmetry line, but now slightly lower than in FIG. 2a. From this situation, the left electromechanical section 34 starts to bend upwards, while the right electromechanical section 32 continues its downwards bending motion. The actuating portion 42 is by this given a motion in a direction indicated by an arrow 62.

Figure 2C:
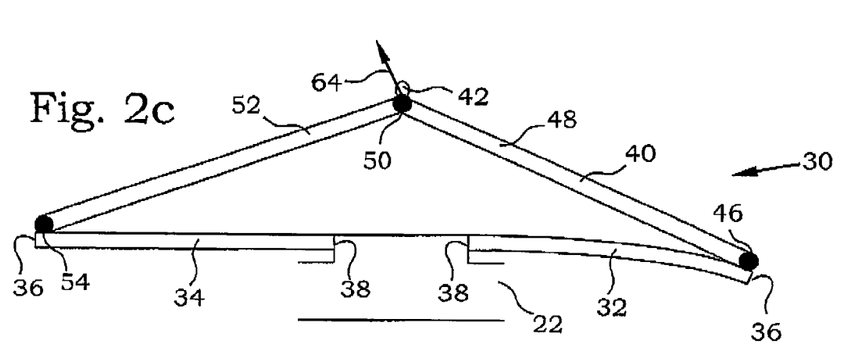

In FIG. 2c, the left electromechanical section 34 is again straight, and the right electromechanical section 32 is bent downwards. This results in a position of the actuating portion 42 still lower than in FIG. 2a, but now to the right of the symmetry line. From this situation, both electromechanical sections 32, 34 are caused to bend upwards, which gives the actuating portion 42 a motion directed in a direction indicated by an arrow 64.

Figure 2D:
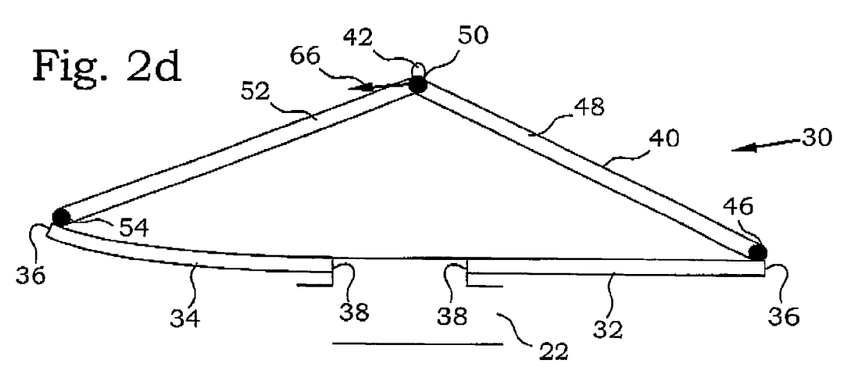

In FIG. 2d, the left electromechanical section 34 is bent up, and the right electromechanical section 32 has regained its straight shape. This results in a position of the actuating portion still to the right of the symmetry line, but now at about the same level as in FIG. 2a. From this situation, the left electromechanical section 34 starts to bend downwards, while the right electromechanical section 32 continues its upwards bending motion. The actuating portion 42 is by this given a motion in a direction indicated by an arrow 66.

The cycle described by the FIGS. 2a–2d results in an elliptical path for the actuating portion 42, e.g. as indicated by the loop 44 in FIG. 1. Since the actuating portion 42 at least occasionally is in contact with the interaction surface 14 of the body 10, the elliptical motion of the actuating portion 42 gives rise to a leftwards motion of the body 10. The driving mechanism can in a general case be based on a quasi-static stepwise motion or on dynamic principles.

In order to increase the power efficiency of the arrangement, mechanical resonances in the electromechanical sections 32, 34 are preferably used. Since the motion of the electromechanical sections 32, 34 is a bending motion with a stroke substantially perpendicular to the displacement direction 12, the mechanical resonance is preferably a bending mode resonance. The electromechanical sections 32, 34 are as indicated by the FIGS. 2a–2d preferably driven at the same frequency, and to have resonances at essentially the same frequency, the electromechanical sections 32, 34 are preferably symmetric with respect of each other.

However, driving two parts of a mechanical arrangement having a resonance at the same frequency will in a general case cause an interaction between the resonances, and unstable or conditions difficult to control may arise, It is thus as briefly mentioned above and according to the present invention important to mechanically isolate the vibrations of the two electromechanical sections 32, 34. The link member 40 does not constitute any problems, since the bendable sections 46, 50 and 54 will act as vibration filters. The joints with the electromechanical sections, i.e. in this embodiment the bendable sections 46 and 54, and/or the link member 40 itself have according to the present invention at least a portion of significantly lower bending stiffness. This is in comparison with the bending stiffness of said two electromechanical sections and for a bending mode as discussed above. In order to further isolate the vibrations, the electromechanical sections 32, 34 are mechanically and preferably also rigidly supported by the backbone portion 22. The transfer of any mechanical vibration energy through the backbone will thus be very small.

In this context, it can be mentioned that it would in principle be possible to modify the actuators of U.S. Pat. No. 6,437,485 to achieve a similar effect but with completely opposite means. Basically no vibrations are transferred to the backbone due to the design of the attachment points. If the section connecting the two electromechanical elements here instead would be designed very rigid, e.g. consisting a material having a material with a considerably higher stiffness or a structure having a stiffening effect, this rigid portion connecting the vibrating portions will also reduce the interference. In certain applications, such an arrangement, still covered by the protection of U.S. Pat. No. 6,437,485, would be sufficient, but in general cases, it is believed to be difficult to design such an efficient rigid portion.

Figure 3:
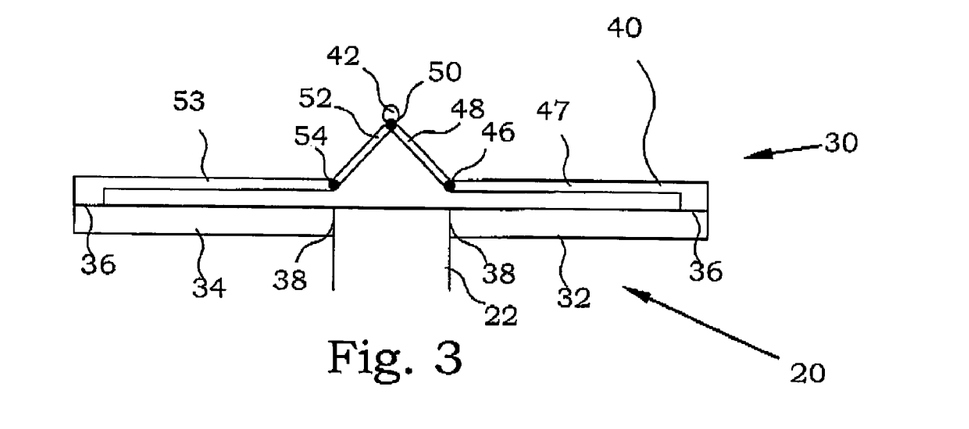
FIG. 3 is a schematic drawing of another embodiment of an electromechanical motor according to the present invention.

FIG. 3 illustrates portions of another embodiment of an electromechanical motor according to the present invention. In order to simplify the reading of the figure, only the driving element 30 and its support to the backbone portion 22 is shown. In this embodiment, the link member 40 further comprises two rigid levers 47, 53. One end of the lever 47 is rigidly attached to the outer end 36 of the first electromechanical section 32, while the other is attached to the bendable section 46. Similarly, one end of the lever 53 is rigidly attached to the outer end 36 of the second electromechanical section 34, while the other is attached to the bendable section 54. These levers 47, 53 will act as magnifiers of the electromechanical section strokes. Furthermore, by adjusting the lengths of the levers 47, 53 and the rigid members 48, 52, a geometrical configuration of the link member 40 can be adapted to almost any desired motion of the actuating portion 42. The lateral extension can still be kept very small compared with prior art systems.

In this embodiment, the joint between the electromechanical sections 32 and 34 is more or less stiff, transferring the actual vibration over to the levers 47, 53. However, the bendable sections 46, 54, which now is an interior part of the link member 40, still serves as vibrational filters.

Figure 4:
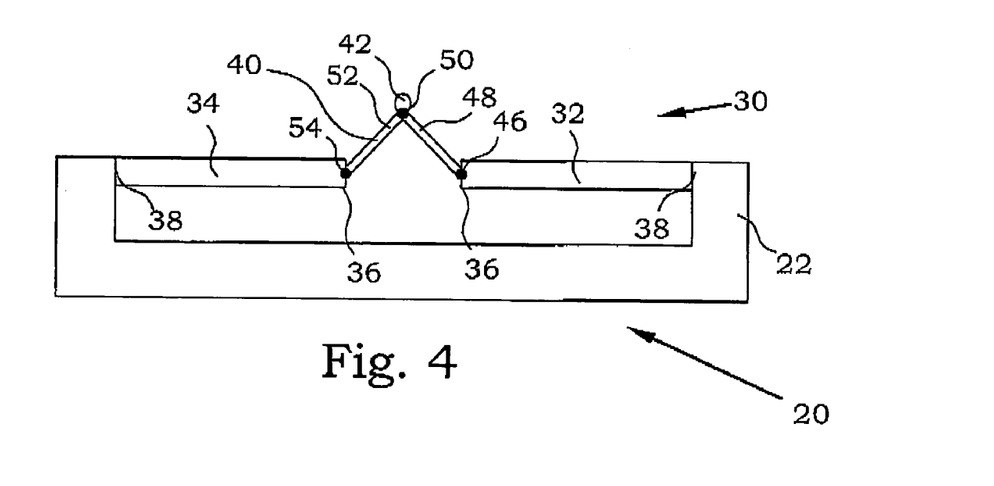
FIG. 4 is a schematic drawing of yet another embodiment of an electromechanical motor according to the present invention.

In FIG. 4, a driving element 30 and backbone portion 22 of yet another embodiment of an electromechanical motor according to the present invention is illustrated. In this embodiment, the backbone portion 22 extends on both sides of the actuating portion 42. The electromechanical sections 32, 34 are supported by the backbone portion 22 at the first ends 38, in this embodiment facing outwards. The second ends 36, in this embodiment the inner ones, are connected to the link member 40. The vibration isolation action of the backbone portion 22 becomes very efficient in such an embodiment. However, this embodiment is believed to require somewhat larger lateral space.

Figure 5A:
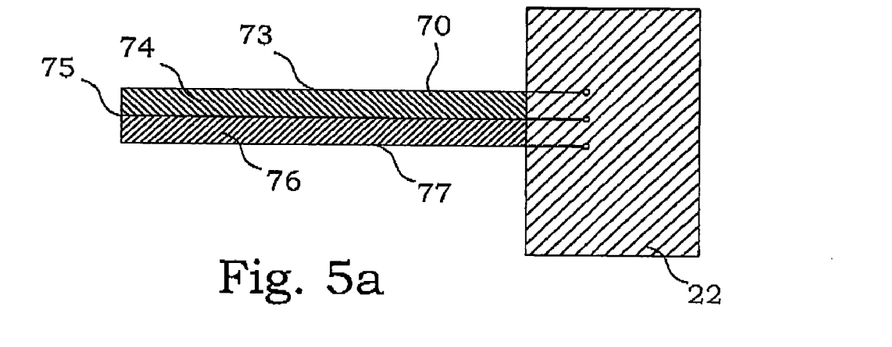
FIG. 5a–5c are schematic drawings of embodiments of electromechanical sections possible to use with the present invention.

The electromechanical sections are in the present invention responsible for creating bending motions that are combined to give an actuating portion a motion path suitable for moving a body. FIG. 5a illustrates one embodiment of an electromechanical section 70 possible to use in the present invention. The electromechanical section 70 comprises two volumes 74, 76 of piezoelectric material. These volumes 74, 76 extend parallel to each other along the main extension direction of the electromechanical section 70, and thus forms a typical bimorph section. Electrodes 73, 75, 77 are provided at each side of the volumes as well as between them. It is thus possible to apply voltages over the piezoelectric volumes 74, 76 independent of each other, thereby causing the piezoelectric volumes 74, 76 to change their shapes. By applying voltages of different size or sign over the two volumes 74, 76, the bimorph section 70 is caused to bend. Such a bimorph arrangement is as such well known in prior art.

Figure 5B:
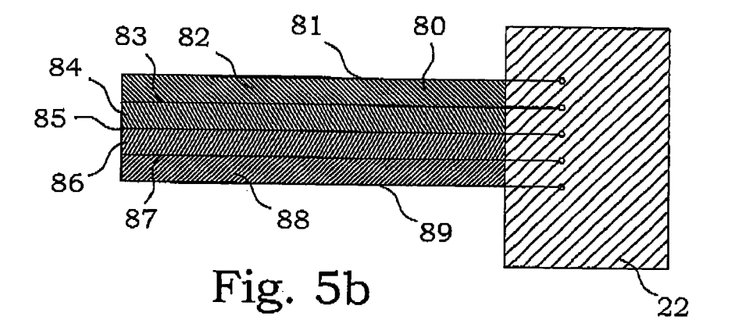

Another embodiment of an electromechanical section 80 possible to use in the present invention, is illustrated in FIG. 5*b*. Here, four volumes 82, 84, 86, 88 of piezoelectric material are stacked in parallel with intermediate electrodes 81, 83, 83, 87, 89, i.e. a multimorph arrangement. By applying suitable voltages, the electromechanical section 80 is caused to bend.

Figure 5C:
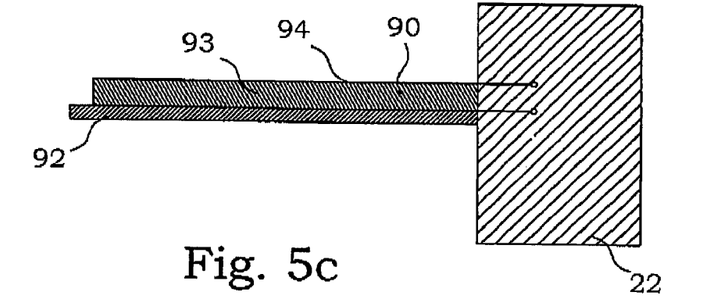

Yet another embodiment of an electromechanical section 90 possible to use in the present invention, is illustrated in FIG. 5*c*. Here, one single piezoelectric volume 93 is attached to a metal plate 92. An electrode 94 is arranged at the opposite side of the piezoelectric volume 93. A voltage can be applied between the metal plate 92 and the electrode 94, thus causing a shape change of the piezoelectric volume 93. Since the piezoelectric volume 93 is attached along substantially its whole length with the metal plate, an elongation or a contraction of the piezoelectric volume 93 will result in a bending of the entire electromechanical section 90. Such a monomorph section 90 is thus also possible to use in the present invention.

A metal-piezoceramic sandwich arrangement as shown e.g. in FIG. 5*c* makes it possible to pre-load the vibrator so that the piezoceramic will always be in an compressive state. This is highly advantageous since it will reduce the risk for brittle failure. The piezoceramic material will then vibrate between two compressive states instead of a tensile and a compressive state.

As anyone skilled in the art understands, combinations of several layers of electromechanical material with one or several layers of non-electromechanical material are also possible to use. The non-electromechanical material could be metal ceramic, reinforced polymers etc.

Figure 6:
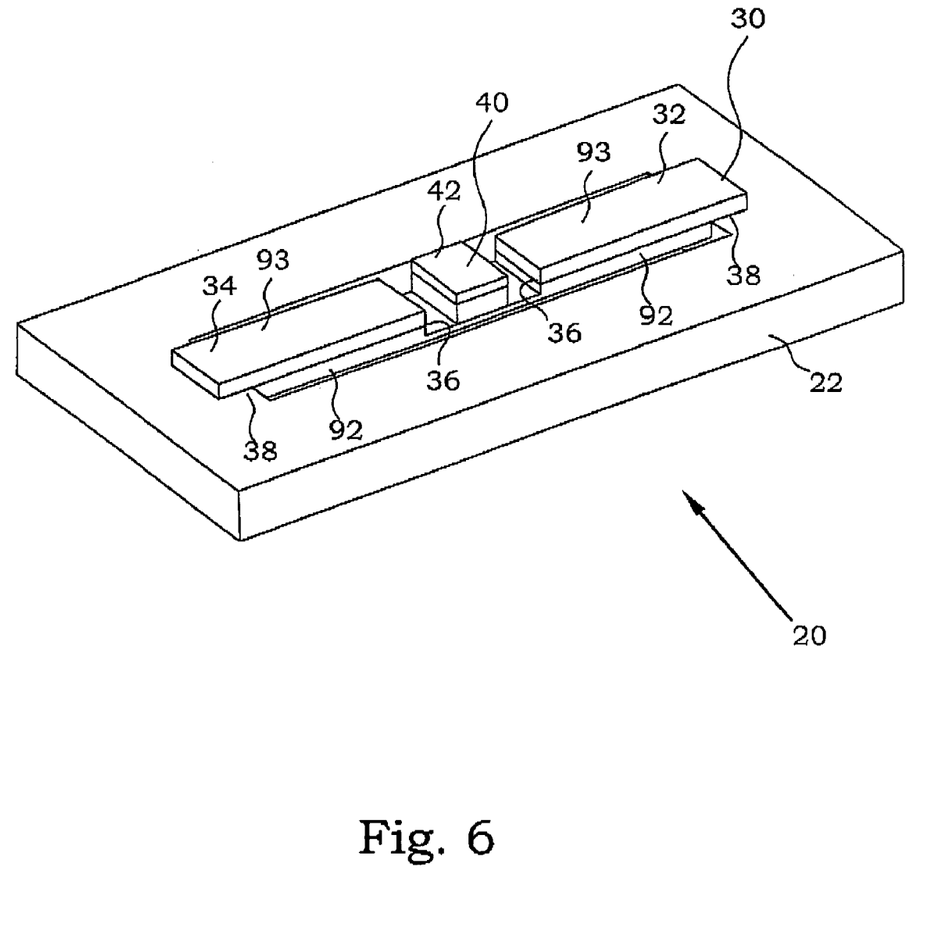
FIG. 6 is a perspective drawing of an embodiment of an electromechanical motor according to the present invention using monomorph sections.

An embodiment of a stator 20 utilizing monomorph electromechanical sections is illustrated in a perspective view in FIG. 6. The basic structure has similarities to FIG. 4, since the electromechanical elements 32, 34 are attached to the backbone portion 22 at respective outer ends. The metal plates 92, the link member 40 and the backbone 22 are in this embodiment machined out of the very same metal plate. Electromechanically active material 93 is then deposited on top of the metal plates 92. The actuating portion 42 may also be covered by suitable material.

Figure 7A:
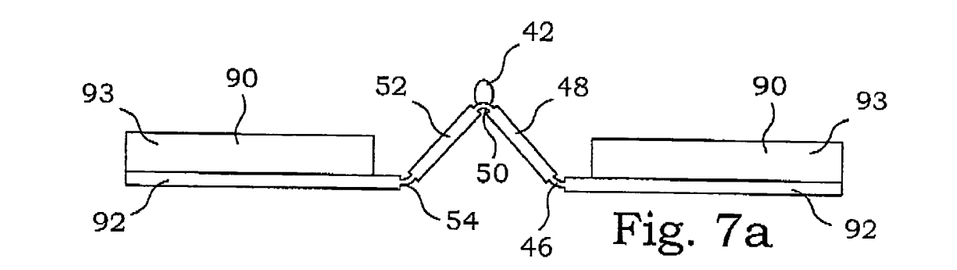
FIGS. 7a, 7b are schematic drawings of embodiments of electromechanical sections and link members possible to use with the present invention.

The link member 40 can be designed in many different ways, both concerning geometry and material. FIG. 7*a* illustrates a side view of an embodiment of an arrangement of electromechanical sections 90 and a link member 40 that is preferred in many applications. The electromechanical sections 90 comprise, as in FIG. 5*c*, a metal plate 92 and a respective piezoelectric volume 93. The link member 40 is manufactured as an integrated part of the metal plate 92. Bending sections 46, 50, 54 are formed in the metal plate as sections having a smaller thickness. The rigid members 48, 52 have the original thickness of the metal plate 92. An arrangement as the one illustrated in FIG. 7*a* can be made extremely inexpensive to manufacture.

Figure 7B:
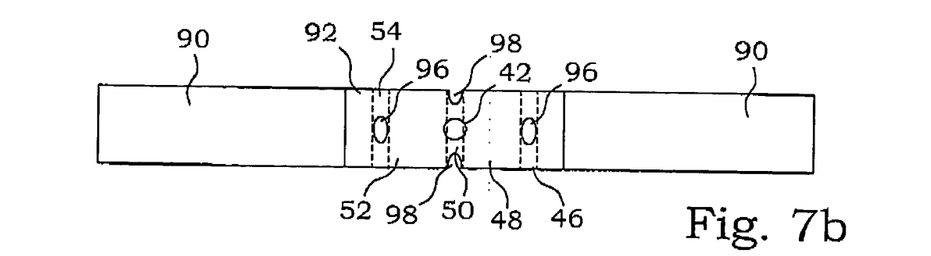

Instead or as a complement of using a reduction in plate thickness as a bendable section, also reduction in efficient width can be used. FIG. 7*b* illustrates a top view of a similar arrangement as in FIG. 7*a*. Here, the bendable sections 46, 50, 54 are given a reduced effective width of material, by introducing notches 98 or holes 96.

Another way of providing a portion with a lower bending stiffness than the surroundings is to use a softer material. For example, with reference to FIG. 6, if the second ends 36 of the electromechanical sections 32, 34 are joined to the link member 40 by a material, having the same cross-section as the electromechanical sections 32, 34, but being considerably softer, a similar vibrational isolation will be achieved.

Figure 8:
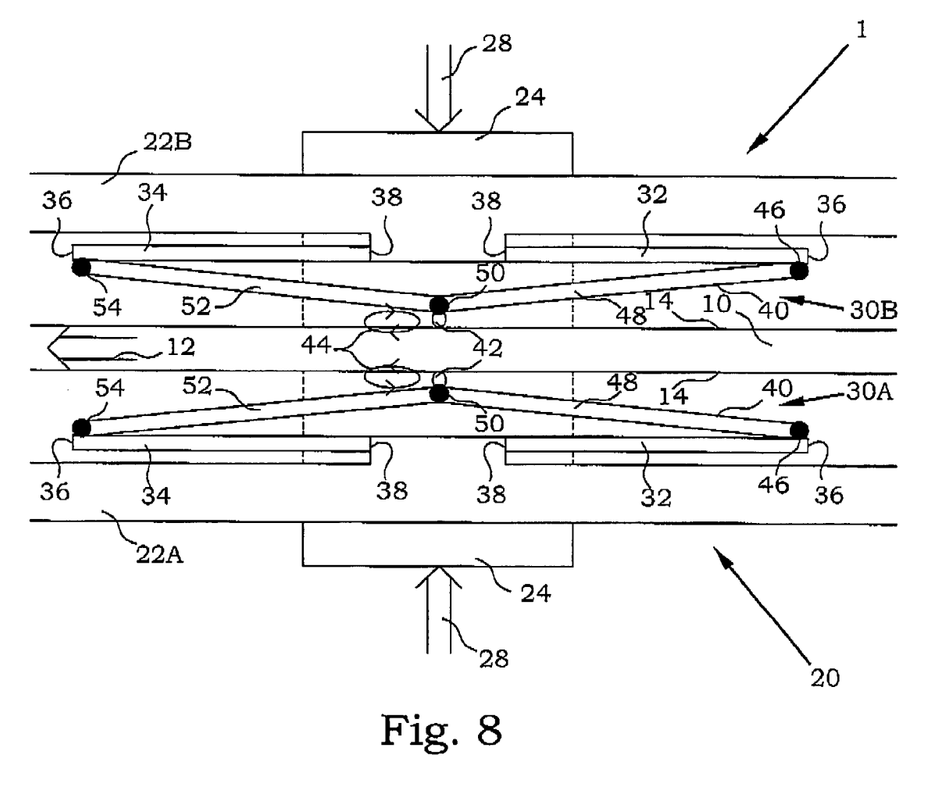
FIG. 8 is a schematic drawing of an embodiment of an electromechanical motor according to the present invention having two driving elements.

In FIG. 1, a motor arrangement, having a driving element on one side of the body is illustrated. A linear bearing is then used to allow the body to move freely from the resilient means 24. An alternative arrangement is illustrated in FIG. 8. Here, two driving elements 30A and 30B are positioned on opposite sides of the body 10. The driving elements are attached to one backbone portion part 22A, 22B, which in turn are pressed together by the resilient means 24. By operating the two driving elements in a coordinated manner, the use for a bearing arrangement becomes unnecessary.

The drive pad should preferably be elastic with a spring constant that is high enough to allow the drive pad to release from the body to be moved and low enough to give a contact time of approximately half the cycle time during operation. Typically, the spring constant of the pad will be of the same order of magnitude as the equivalent spring constant of the vibrating parts of the stator.

Figure 9:
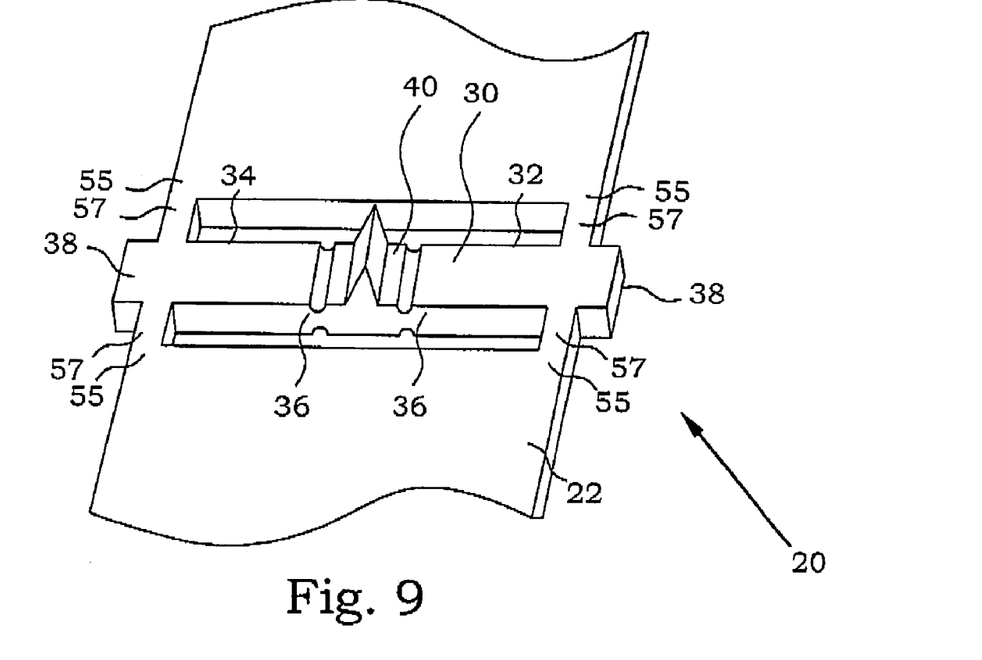
FIG. 9 is a perspective drawing of a stator of an electromechanical motor supported at the sides of the electromechanical sections.

FIG. 9 illustrates a stator 20 of an electromechanical motor, where the electromechanical sections 32 and 34 are connected to the backbone 22 by transversal connectors 57. One transversal connector 57 on each side of the respective electromechanical section 32 and 34 forms a sideward link to the backbone 22. The transversal connectors 57 are rigidly attached to the backbone, but may themselves offer suitable resilient properties. The transversal connectors 57 are attached to the electromechanical sections at or close to the second ends 38 of the electromechanical sections, and at least closer to the second ends 38 than to the first ends 36. In cases where the transversal connectors 57 are attached some distance from the actual second end 38, the free end of the electromechanical sections 32, 34 can be utilized to achieve requested vibrational properties of the electromechanical sections 32, 34 as a whole.

The transversal connectors in FIG. 9 can be exchanged with other mechanical supports giving similar resilient response. For instance, using a backbone plate below the drive element, the drive element can be attached to ridges at the same distance from the second ends 38 of the electromechanical sections as illustrated in FIG. 9. The ridges are preferentially oriented orthogonal to the drive element extension. Such connectors will make it possible to make a motor with a width and length as small as the drive element, while the height increase somewhat in comparison with the embodiment shown in FIG. 9. The backbone and supports are selected with respect to the size limits in the application.

The backbone is normally considered stiff but since the aim is to miniaturize the motors as much as possible, a smaller backbone will always to some extent influence the resonant vibrations of the motor. The normal solution is to design the backbone in such a way that there will be no resonant vibrations close to the operation frequency of the motor. The higher stiffness in the backbone makes it reasonable to consider it rigid in comparison with the connectors. The position of the supports as well as connector resilience will be important for motor function and has to be optimized with respect to performance and robustness. The position of the supports depends on factors such as masses of link members and resilience in the bendable sections and typically CAD/simulation software is used to determine the optimum design.

Figure 10:
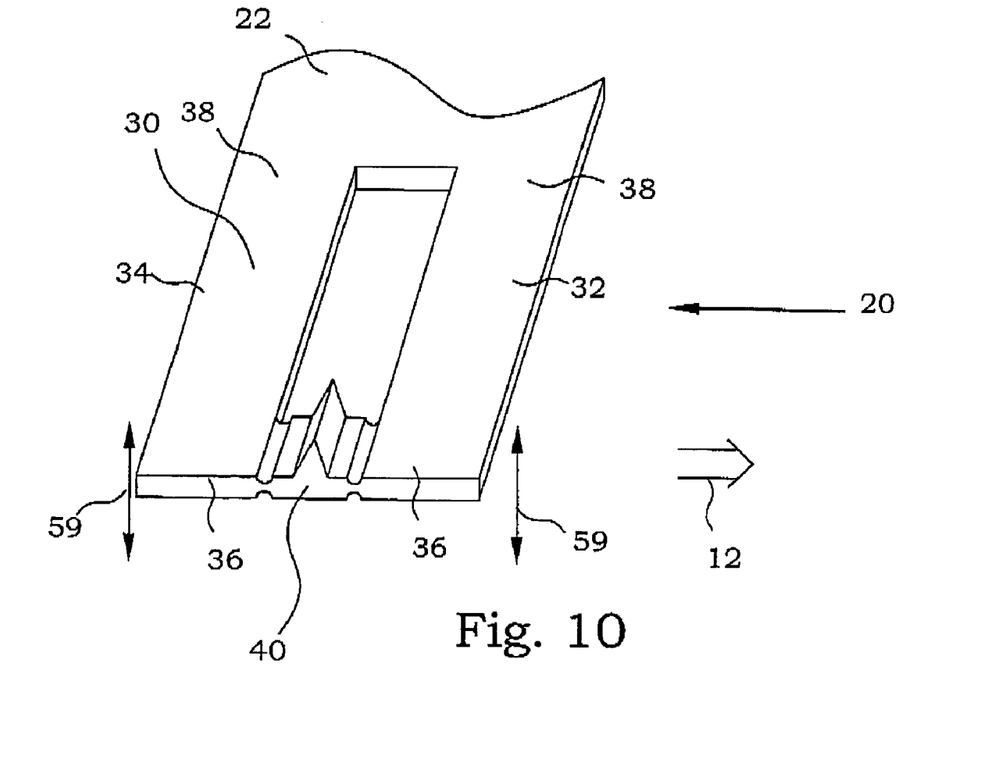
FIG. 10 is a perspective drawing of a stator of an electromechanical motor having electromechanical sections directed perpendicular to the motion direction.

Finally, FIG. 10, illustrates a stator 20, where the vibrating electromechanical sections 32, 34 are positioned perpendicular to the actual motion direction 12. The electromechanical sections 32, 34 are vibrating in an up and down direction 59, and the link member 40 actuates on a body to be moved placed essentially above the stator 20, as drawn in the figure. However, the perpendicular positioning of the vibrating electromechanical sections 32, 34 makes the configuration too space consuming in many applications.

It will be understood by those skilled in the art that various modifications and changes may be made to the present invention without departure from the scope thereof, which is defined by the appended claims.

REFERENCES

U.S. Pat. No. 5,089,740
U.S. Pat. No. 5,453,653
U.S. Pat. No. 6,373,170
U.S. Pat. No. 6,392,328
U.S. Pat. No. 6,437,485
Swedish patent 9300305-1
German patent DD 143 682

What is claimed is:

1. Electromechanical motor, comprising:
    stator, having a driving element and a backbone portion; and
    body to be moved in a main displacement direction by said driving element interacting with said body;
    said driving element having two electromechanical sections extended in a main extension direction essentially parallel to said main displacement direction and being connected to said backbone portion;
    said two electromechanical sections being excitable in a vibration mode with strokes substantially perpendicular to said main displacement direction;
    said two electromechanical sections being interconnected with each other at respective first ends via a link member;
    said link member having a single actuating portion for said interacting with said body;
    at least one of:
        respective joints between said link member and said respective first ends; and
        a portion of said link member,
    having a portion of significantly lower bending stiffness than a bending stiffness of said two electromechanical sections, in the direction of said strokes.

2. Electromechanical motor according to claim 1, wherein said two electromechanical sections are connected to said backbone at respective connection points closer to a respective second end of said two electromechanical sections than said respective first ends, said respective second ends being essential opposite to said respective first ends.

3. Electromechanical motor according to claim 2, wherein said connection points being essentially immovable with respect of the main part of said backbone portion.

4. Electromechanical motor according to claim 3, wherein said two electromechanical sections being rigidly connected at positions substantially at said respective second end.

5. Electromechanical motor according to claim 1, wherein said portion of significantly lower bending stiffness comprises a section with reduced dimension in the direction of said strokes compared with said two electromechanical sections.

6. Electromechanical motor according to claim 1, wherein said portion of significantly lower bending stiffness comprises a section with a softer material than in said two electromechanical sections.

7. Electromechanical motor according to claim 1, wherein said link member comprises one rigid member connected by two said portions of significantly lower bending stiffness, said actuating portion being arranged in the middle of said rigid member.

8. Electromechanical motor according to claim 1, wherein said link member comprises two rigid members connected by a first bendable section, said actuating portion being arranged on or in vicinity of said first bendable section.

9. Electromechanical motor according to claim 8, wherein said portions of significantly lower bending stiffness are constituted by a second and a third bendable section, respectively, between said rigid members and said electromechanical sections.

10. Electromechanical motor according to claim 9, wherein said link member further comprises rigid levers between said second and third bendable sections, respectively, and said electromechanical sections.

11. Electromechanical motor according to claim 10, wherein said rigid levers, rigid members and/or bendable sections are made by a metal plate provided with bending notches or holes.

12. Electromechanical motor according to claim 1, wherein said electromechanical sections are selected from the group of bimorph sections, monomorph sections and multimorph sections.

13. Electromechanical motor according to claim 1, further comprising resilient means arranged to apply a normal force between said driving element and said body.

14. Electromechanical motor according to claim 2, wherein said connection points are situated on the side of the driving element.

15. Electromechanical motor according to claim 2, wherein said connection points are on top or bottom of the driving element.

* * * * *